(12) United States Patent
Kuno et al.

(10) Patent No.: US 12,308,220 B2
(45) Date of Patent: May 20, 2025

(54) WAFER PLACEMENT TABLE

(71) Applicant: NGK Insulators, Ltd., Nagoya (JP)

(72) Inventors: Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 199 days.

(21) Appl. No.: 18/179,490

(22) Filed: Mar. 7, 2023

(65) Prior Publication Data
US 2024/0105428 A1  Mar. 28, 2024

Related U.S. Application Data

(63) Continuation of application No. PCT/JP2022/035900, filed on Sep. 27, 2022.

(51) Int. Cl.
*H01T 23/00* (2006.01)
*H01J 37/32* (2006.01)

(52) U.S. Cl.
CPC .. *H01J 37/32724* (2013.01); *H01J 37/32807* (2013.01)

(58) Field of Classification Search
None
See application file for complete search history.

(56) References Cited

U.S. PATENT DOCUMENTS

| | | |
|---|---|---|
| 2007/0029740 A1 | 2/2007 | Natsuhara et al. |
| 2008/0079021 A1* | 4/2008 | Bayerer ............... H01L 23/473 |
| | | 257/E23.051 |
| 2013/0192806 A1 | 8/2013 | Noishiki et al. |
| 2015/0077895 A1 | 3/2015 | Jindo et al. |
| 2019/0304815 A1 | 10/2019 | Suzuki et al. |

(Continued)

FOREIGN PATENT DOCUMENTS

| | | |
|---|---|---|
| JP | 2000-311932 A | 11/2000 |
| JP | 2007-043042 A | 2/2007 |

(Continued)

OTHER PUBLICATIONS

International Search Report and Written Opinion (Application No. PCT/JP2022/035900) dated Nov. 15, 2022.

(Continued)

*Primary Examiner* — Stephen W Jackson
(74) *Attorney, Agent, or Firm* — BURR PATENT LAW, PLLC

(57) ABSTRACT

A wafer placement table includes a ceramic plate having a wafer placement surface and an electrode, a cooling plate made of a metal-ceramic composite and having a cooling medium passage, and a joining layer configured to join the plates. A distance from the wafer placement surface to at least one of upper base or lower base of the cooling medium passage is not constant. The cooling plate has a plurality of plate portions including a first plate portion and a second plate portion, and has a structure in which the plurality of plate portions metal-joined to each other. The first plate portion has a first passage portion which is a through groove having the same shape as the cooling medium passage. The second plate portion has a second passage portion which is a bottomed groove disposed in at least part of a region facing the first passage portion.

5 Claims, 6 Drawing Sheets

(56) References Cited

U.S. PATENT DOCUMENTS

| | | | |
|---|---|---|---|
| 2020/0035535 A1* | 1/2020 | Parkhe | H01L 21/67103 |
| 2020/0286755 A1 | 9/2020 | Ito | |
| 2023/0115033 A1* | 4/2023 | Kuno | H01L 21/67109 |
| | | | 361/234 |
| 2024/0105428 A1* | 3/2024 | Kuno | H01J 37/32807 |

FOREIGN PATENT DOCUMENTS

| | | | |
|---|---|---|---|
| JP | 2013-155971 A | 8/2013 |
| JP | 5666748 B1 | 2/2015 |
| JP | 2019-176032 A | 10/2019 |
| JP | 2020-145238 A | 9/2020 |

OTHER PUBLICATIONS

English translation of the International Preliminary Report on Patentability (Chapter I) dated Apr. 10, 2025 (Application No. PCT/JP2022/035900).

\* cited by examiner

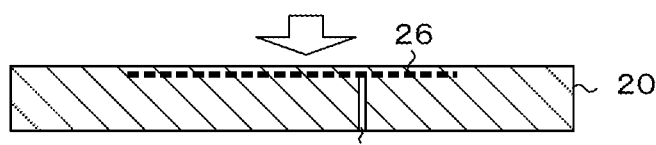
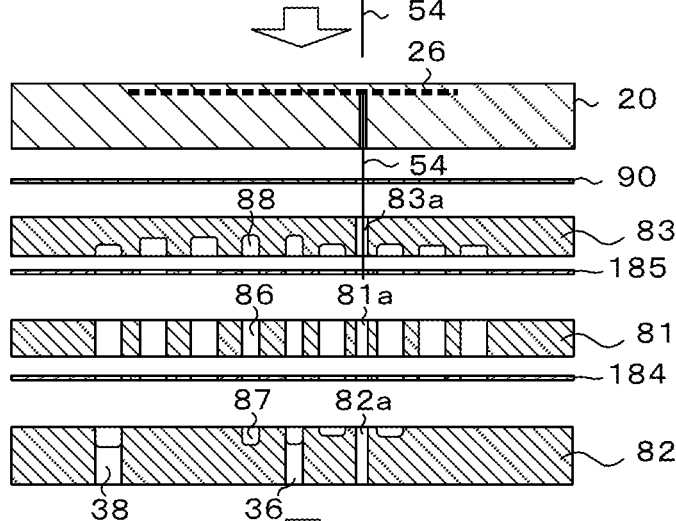
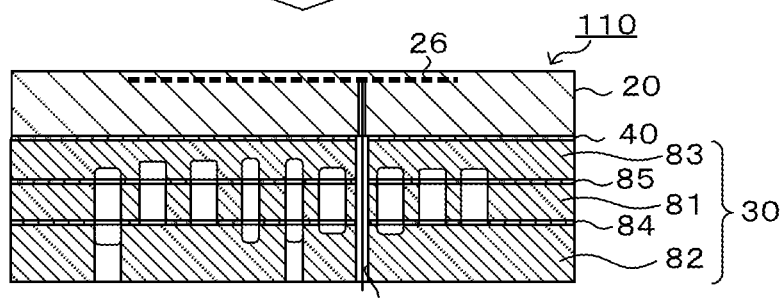
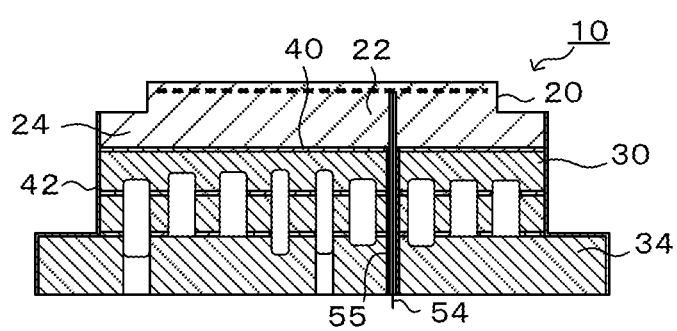

WAFER PLACEMENT TABLE

BACKGROUND OF THE INVENTION

1. Field of the Invention

The present invention relates to a wafer placement table.

2. Description of the Related Art

A known wafer placement table includes a ceramic plate having a wafer placement surface and containing an electrode therein, a cooling plate having a cooling medium passage, and a joining layer configured to join the ceramic plate to the cooling plate. For example, Patent Literature 1 describes a wafer placement table in which a cooling plate is made of a metal matrix composite having substantially the same linear thermal expansion coefficient as a ceramic plate. To make such a cooling plate, first, an upper substrate, a middle substrate, and a lower substrate, which are disc-shaped plates, are prepared. Next, a punched portion is formed in the middle substrate by punching the middle substrate from one side to the other side in such a way that the punched portion has the same shape as a cooling medium passage. The upper substrate and the lower substrate each have flat surfaces on both sides. The upper, middle, and lower substrates are then joined together by thermal compression bonding, with a layer of metal joining material sandwiched between the upper and middle substrates and with another layer of metal joining material sandwiched between the middle and lower substrates. This produces a cooling plate in which the punched portion serves as a cooling medium passage.

CITATION LIST

Patent Literature

PTL 1: Japanese Patent No. 5666748

SUMMARY OF THE INVENTION

In the wafer placement table described in Patent Literature 1, the distance from an upper base of the cooling medium passage to a wafer placement surface and the distance from a lower base of the cooling medium passage to the wafer placement surface are constant throughout the length of the cooling medium passage. This makes it difficult to achieve sufficient thermal uniformity in the wafer. Therefore, it has been desired to develop wafer placement tables with which sufficient thermal uniformity in the wafer can be achieved. Also, it has been desired that such wafer placement tables be manufactured at low cost.

The present invention has been made to solve the problems described above. A primary object of the present invention is to improve thermal uniformity in the wafer and reduce the cost of manufacture.

[1] A wafer placement table according to the present invention includes a ceramic plate having, at an upper surface thereof, a wafer placement surface on which a wafer can be placed, and containing an electrode therein; a cooling plate made of a metal-ceramic composite and having a cooling medium passage; and a joining layer configured to join the ceramic plate to the cooling plate. In the wafer placement table, a distance from the wafer placement surface to at least one of upper base or lower base of the cooling medium passage is not constant throughout a length of the cooling medium passage but varies. The cooling plate has a plurality of plate portions including a first plate portion and a second plate portion, and has a structure in which the plurality of plate portions metal-joined to each other. The first plate portion having a first passage portion which is a through groove provided to have the same shape as the cooling medium passage in plan view. The second plate portion having a second passage portion which is a bottomed groove disposed in at least part of a region facing the first passage portion.

In the wafer placement table described above, the distance from the wafer placement surface to at least one of the upper base or the lower base of the cooling medium passage is not constant throughout the length of the cooling medium passage but varies. For example, by varying the distance from the wafer placement surface to at least one of the upper base or the lower base of the cooling medium passage in accordance with the distribution of high-temperature-prone and low-temperature-prone regions of the wafer placement surface, the thermal uniformity in the wafer can be improved. The cooling plate has a plurality of plate portions including a first plate portion and a second plate portion, and has a structure in which the plurality of plate portions metal-joined to each other. The first plate portion having the first passage portion which is a through groove provided to have the same shape as the cooling medium passage in plan view. The second plate portion having the second passage portion which is a bottomed groove disposed in at least part of the region facing the first passage portion. The first passage portion can be formed at low cost by, for example, a hollowing-out process. The second passage portion can be formed by, for example, a cutting or grinding process. The second passage portion, which is relatively shallow in depth, can be formed in a short time and at low cost.

[2] In the wafer placement table (or in the wafer placement table described in [1]), a width of the cooling medium passage may not be constant throughout the length of the cooling medium passage but may vary. By varying the width of the cooling medium passage in accordance with the distribution of high-temperature-prone and low-temperature-prone regions of the wafer placement surface, the thermal uniformity in the wafer can be improved.

[3] In the wafer placement table (or in the wafer placement table described in [1] or [2]), the cooling medium passage may be partially provided with a fin on at least one of the upper base or the lower base of the cooling medium passage. With the cooling medium passage having a fin corresponding to a high-temperature-prone region of the wafer placement surface, the wafer can be cooled down efficiently.

[4] In the wafer placement table (or in the wafer placement table described in any one of [1] to [3]), the cooling plate may include a third plate portion joined to a surface of the first plate portion opposite the second plate portion, and the third plate portion may have a third passage portion which is a bottomed groove disposed in at least part of a region facing the first passage portion. This makes it possible to change the position of one or both of the upper and lower bases of the cooling medium passage.

[5] In the wafer placement table (or in the wafer placement table described in any one of [1] to [3]), the cooling plate may include a third plate portion joined to a surface of the first plate portion opposite the second plate portion, and a surface of the third plate portion facing the first passage portion may be flat. This makes it possible to change the position of one of the upper and lower bases of the cooling medium passage.

BRIEF DESCRIPTION OF THE DRAWINGS

FIGS. 4A to 4F illustrate processes of manufacturing the wafer placement table 10.

DETAILED DESCRIPTION OF THE INVENTION

Figure 1:
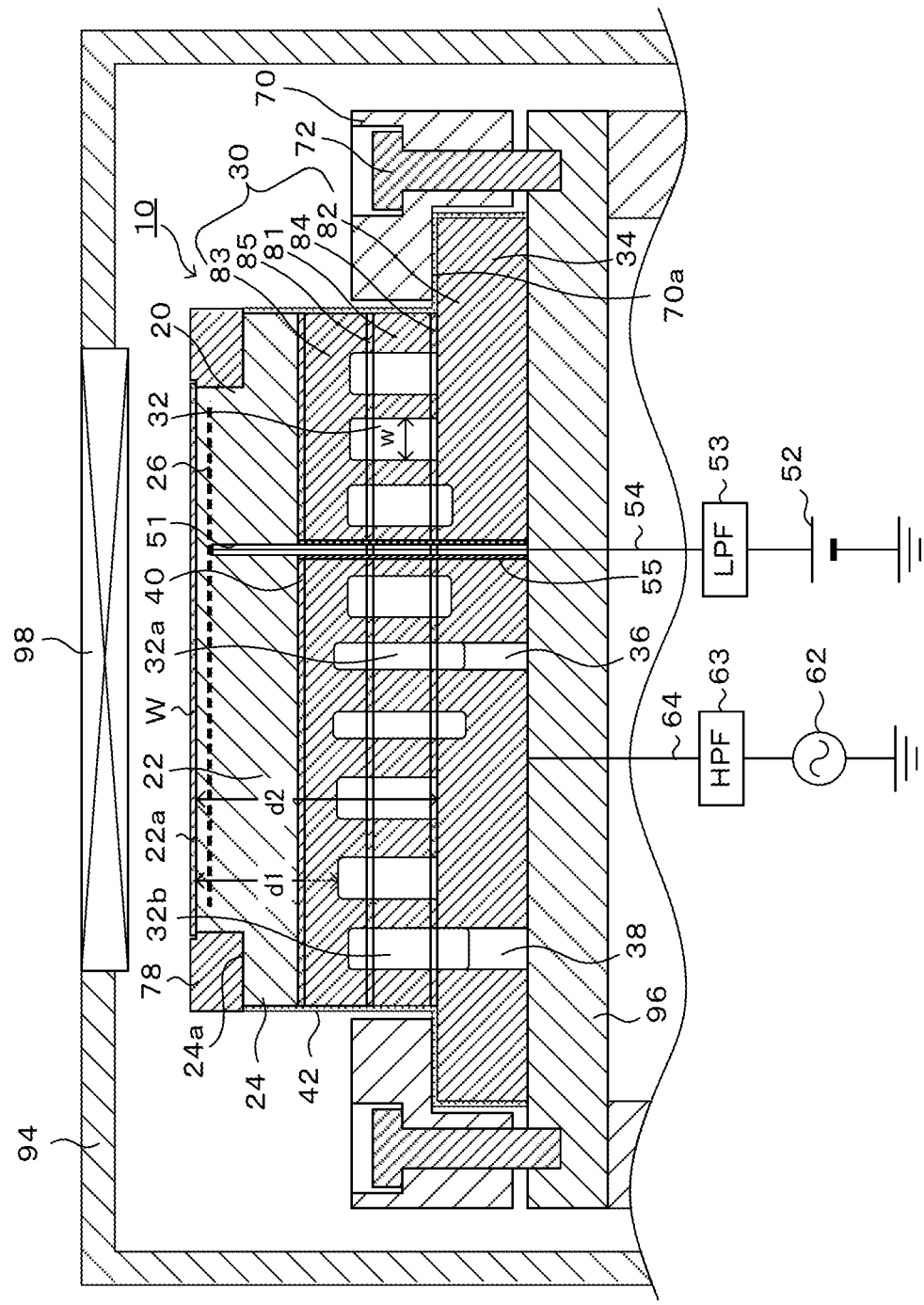
FIG. 1 is a vertical cross-sectional view of a wafer placement table 10 installed in a chamber 94.
Figure 2:
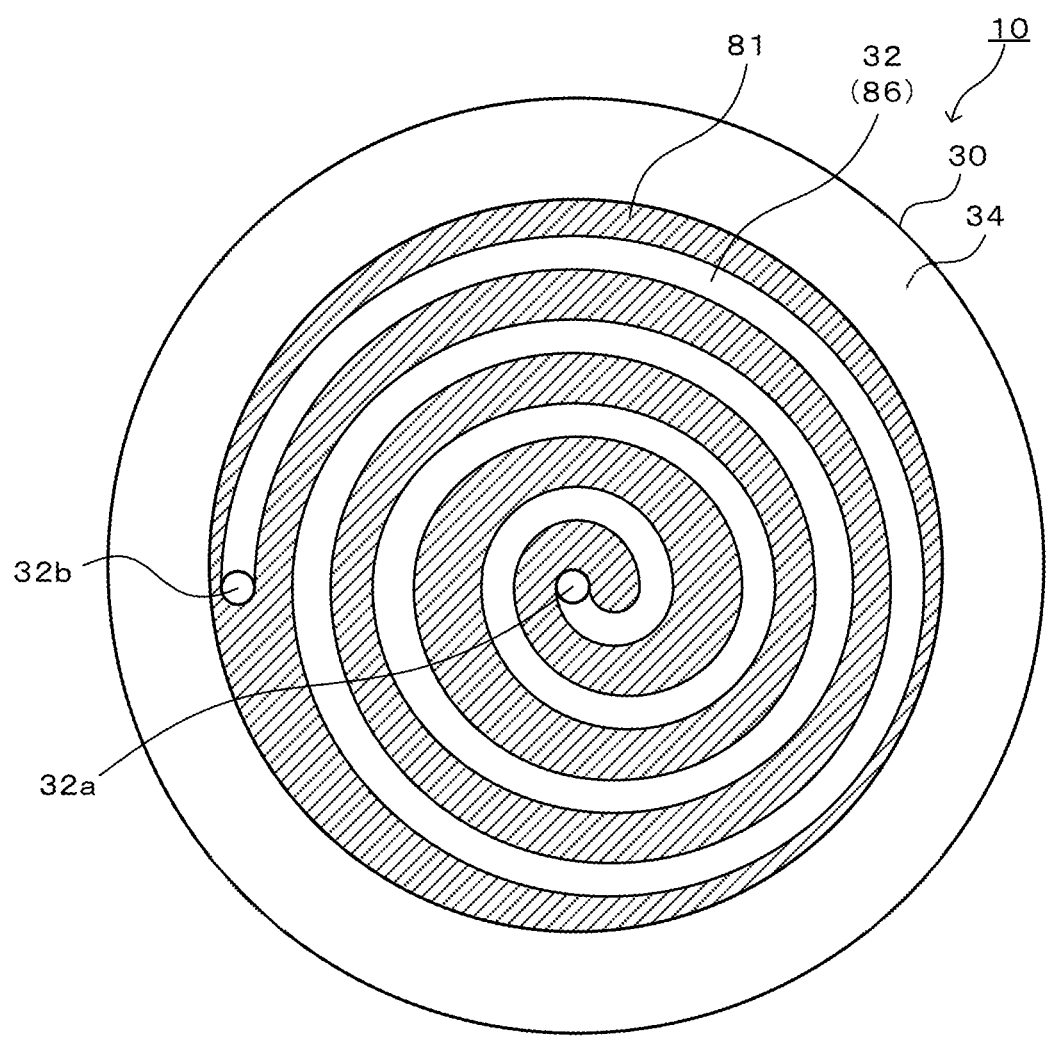
FIG. 2 is a cross-sectional view of a cooling plate 30 taken along a horizontal plane passing through a first thin plate portion 81, as viewed from above.
Figure 3:
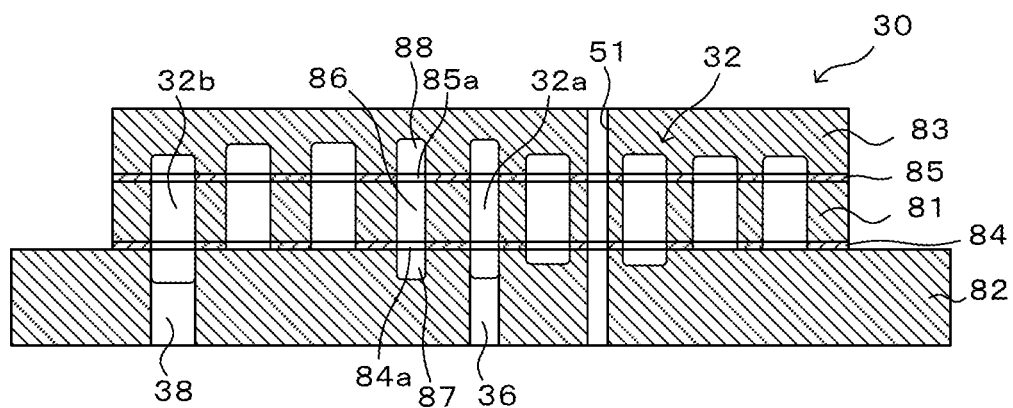
FIG. 3 is a vertical cross-sectional view of the cooling plate 30.

Preferred embodiments of the present invention will now be described with reference to the drawings. FIG. 1 is a vertical cross-sectional view of a wafer placement table 10 installed in a chamber 94 (i.e., a cross-sectional view taken along a plane containing a central axis of the wafer placement table 10). FIG. 2 is a cross-sectional view of a cooling plate 30 taken along a horizontal plane passing through a first thin plate portion 81, as viewed from above. Note that a terminal hole 51, a feed terminal 54, and an insulating pipe 55 are not shown in FIG. 2.

The wafer placement table 10 is used to perform, for example, plasma CVD or plasma etching on a wafer W. The wafer placement table 10 is secured to an installation plate 96 that is disposed inside the chamber 94 designed for semiconductor processes. The wafer placement table 10 includes a ceramic plate 20, a cooling plate 30, and a metal joining layer 40.

The ceramic plate 20 has an outer portion 24 outside a central portion 22 having a circular wafer placement surface 22a. The outer portion 24 has an annular focus ring placement surface 24a. A focus ring may hereinafter be abbreviated as "FR". The wafer W is placed on the wafer placement surface 22a, and a focus ring 78 is placed on the FR placement surface 24a. The ceramic plate 20 is made of a ceramic material, such as alumina or aluminum nitride. The FR placement surface 24a is one step lower than the wafer placement surface 22a.

The central portion 22 of the ceramic plate 20 contains therein a wafer attracting electrode 26 disposed adjacent to the wafer placement surface 22a. The wafer attracting electrode 26 is made of a material containing, for example, W, Mo, WC, or MoC. The wafer attracting electrode 26 is a disc-shaped or mesh-type monopolar electrostatic attracting electrode. Of layers of the ceramic plate 20, a layer above the wafer attracting electrode 26 serves as a dielectric layer. The wafer attracting electrode 26 is connected to a wafer attracting direct-current power supply 52 by a feed terminal 54 therebetween. The feed terminal 54 is inserted in the terminal hole 51 disposed between the lower surface of the wafer attracting electrode 26 and the lower surface of the cooling plate 30 in the wafer placement table 10. In the terminal hole 51, the feed terminal 54 passes through the insulating pipe 55 disposed in a through hole vertically penetrating the cooling plate 30 and the metal joining layer 40, and extends from the lower surface of the ceramic plate 20 to reach the wafer attracting electrode 26. The wafer attracting direct-current power supply 52 and the wafer attracting electrode 26 are provided with a low-pass filter (LPF) 53 therebetween.

The cooling plate 30 is a disc-shaped plate having a cooling medium passage 32 in which a cooling medium can circulate. The cooling plate 30 is obtained by metal-joining first to third thin plate portions 81 to 83. The cooling medium passing through the cooling medium passage 32 is preferably a liquid and is preferably an electrically insulating liquid. Examples of the electrically insulating liquid include a fluorinated inert liquid. The first to third thin plate portions 81 to 83 are made of a composite material of metal and ceramic (hereinafter also referred to as a metal-ceramic composite). In the cooling plate 30, the second thin plate portion 82 is joined to the lower surface of the first thin plate portion 81, with a first metal joining layer 84 interposed therebetween, and the third thin plate portion 83 is joined to the upper surface of the first thin plate portion 81, with a second metal joining layer 85 interposed therebetween. The metal-ceramic composite is, for example, a metal matrix composite (MMC) or a ceramic matrix composite (CMC). Examples of the metal-ceramic composite include a material composed of Si, SiC, and Ti, and a SiC porous body impregnated with Al and/or Si. A material composed of Si, SiC, and Ti is referred to as SiSiCTi, a SiC porous body impregnated with Al is referred to as AlSiC, and a SiC porous body impregnated with Si is referred to as SiSiC. When the ceramic plate 20 is an alumina plate, a metal-ceramic composite used in the cooling plate 30 is preferably MMC (such as AlSiC or SiSiCTi) having a thermal expansion coefficient close to that of alumina. The cooling plate 30 is connected to a RF power supply 62 by a feed terminal 64 therebetween. The cooling plate 30 and the RF power supply 62 are provided with a high-pass filter (HPF) 63 therebetween. The cooling plate 30 has a flange portion 34 on the lower side thereof. The flange portion 34 is used to clamp the wafer placement table 10 to the installation plate 96.

Referring to FIG. 2, which illustrates a cross section of the cooling medium passage 32 taken along a horizontal plane as viewed from above, the cooling medium passage 32 is formed in a one-stroke pattern from an inlet 32a to an outlet 32b over the entire region of the cooling plate 30, except the flange portion 34. The inlet 32a is connected to a cooling medium supply path 36, and the outlet 32b is connected to a cooling medium discharge path 38. The cooling medium supplied from the cooling medium supply path 36 passes through the inlet 32a, flows through the cooling medium passage 32, passes through the outlet 32b, and is discharged from the cooling medium discharge path 38. The cooling medium discharged from the cooling medium discharge path 38 is temperature-adjusted by an external cooling-medium circulator (not shown) and returned to the cooling medium supply path 36. In the present embodiment, the cooling medium passage 32 is formed in a spiral shape. As illustrated in FIG. 1, a distance d1 from the wafer placement surface 22a to an upper base of the cooling medium passage 32 and a distance d2 from the wafer placement surface 22a to a lower base of the cooling medium passage 32 are not constant throughout the length of the cooling medium passage 32. The distances d1 and d2 are shorter in some places and longer in others. The distances d1 and d2 are set in accordance with the distribution of high-temperature-prone and low-temperature-prone regions of the wafer W that tend to be higher and lower, respectively, in temperature during use of the wafer placement table 10. As illustrated in FIG. 1, a width w of the cooling medium passage 32 is not constant throughout the length of the cooling medium passage 32. The width w is narrower in some places and wider in others. The width w is set in accordance with the distribution of high-temperature-prone and low-temperature-prone regions of the wafer W which tend to be higher and lower, respectively, in temperature during use of the wafer placement table 10. For example, at a position of the cooling medium passage 32 directly below a high-temperature-prone region of the wafer W, the distance d1 may be shorter, or pressure loss may be greater to facilitate heat exchange between the cooling medium and the wafer W. To increase the pressure loss, for example, the distance d2 may be shortened or the width w may be narrowed to reduce the cross-sectional area of the cooling medium passage 32. For convenience, FIG. 2 illustrates the width w of the cooling medium passage 32 as being constant throughout the length of the cooling medium passage 32.

The first thin plate portion 81 has a first passage portion 86. The first passage portion 86 is a through groove (i.e., a groove vertically penetrating the first thin plate portion 81) having the same shape as the cooling medium passage 32 in plan view. The second thin plate portion 82 has a second passage portion 87. The second passage portion 87 is a bottomed groove (blind groove) disposed in at least part of a region facing the first passage portion 86. The third thin plate portion 83 has a third passage portion 88. The third passage portion 88 is a bottomed groove disposed in at least part of a region facing the first passage portion 86. The metal joining layers 84 and 85 are provided with through grooves 84a and 85a, respectively, at respective positions facing the first passage portion 86. The through grooves 84a and 85a have the same shape as the first passage portion 86 in plan view. The cooling medium passage 32 is thus defined by the second passage portion 87, the through groove 84a, the first passage portion 86, the through groove 85a, and the third passage portion 88. The metal joining layers 84 and 85 can be formed in the same manner as the metal joining layer 40 described below.

The metal joining layer 40 joins the lower surface of the ceramic plate 20 to the upper surface of the cooling plate 30. The metal joining layer 40 may be, for example, a solder layer or a brazing metal layer. The metal joining layer 40 is formed, for example, by thermal compression bonding (TCB). The TCB is a known method in which a metal joining material is placed between two components to be joined, which are then pressure-bonded while being heated to a temperature lower than or equal to the solidus temperature of the metal joining material.

A side face of the outer portion 24 of the ceramic plate 20, a perimeter of the metal joining layer 40, and a side face of the cooling plate 30 are coated with an insulating film 42. The insulating film 42 is formed, for example, by thermal spraying with alumina or yttria.

The wafer placement table 10 is mounted by means of a clamp member 70 onto the installation plate 96 disposed inside the chamber 94. The clamp member 70 is an annular member having a substantially inverse L-shape in cross section. The clamp member 70 has an inner stepped surface 70a. The wafer placement table 10 and the installation plate 96 are integrated into one by the clamp member 70. With the inner stepped surface 70a of the clamp member 70 placed on the flange portion 34 of the cooling plate 30 of the wafer placement table 10, bolts 72 are each inserted from the upper surface of the clamp member 70 and screwed into a screw hole in the upper surface of the installation plate 96. The bolts 72 are mounted at a plurality of (e.g., eight or twelve) points equally spaced along the circumferential direction of the clamp member 70. The clamp member 70 and the bolts 72 may be made of an insulating material, or may be made of a conductive material (such as metal).

An example of manufacture of the wafer placement table 10 will now be described with reference to FIGS. 4A to 4F and FIGS. 5A and 5B. FIGS. 4A to 4F illustrate processes of manufacturing the wafer placement table 10, and FIGS. 5A and 5B illustrate processes of machining the first to third thin plate portions 81 to 83.

First, the ceramic plate 20 is made by hot-press firing a ceramic powder molded body (FIG. 4A). The ceramic plate 20 contains the wafer attracting electrode 26 therein. Next, a terminal-hole upper portion 151a is formed, which extends from the lower surface of the ceramic plate 20 to the wafer attracting electrode 26 (FIG. 4B). The feed terminal 54 is then inserted into the terminal-hole upper portion 151a and joined to the wafer attracting electrode 26 (FIG. 4C).

Figure 5A:
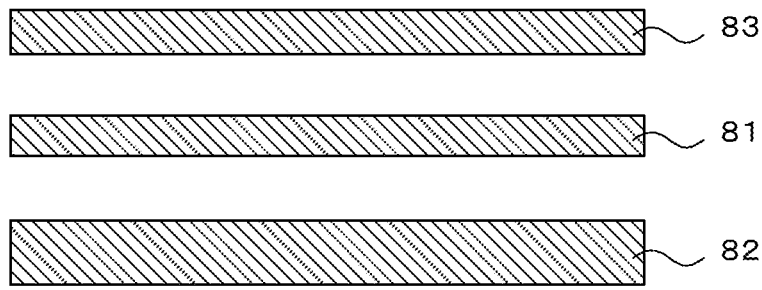
FIGS. 5A and 5B illustrate processes of machining first to third thin plate portions 81 to 83.
Figure 5B:
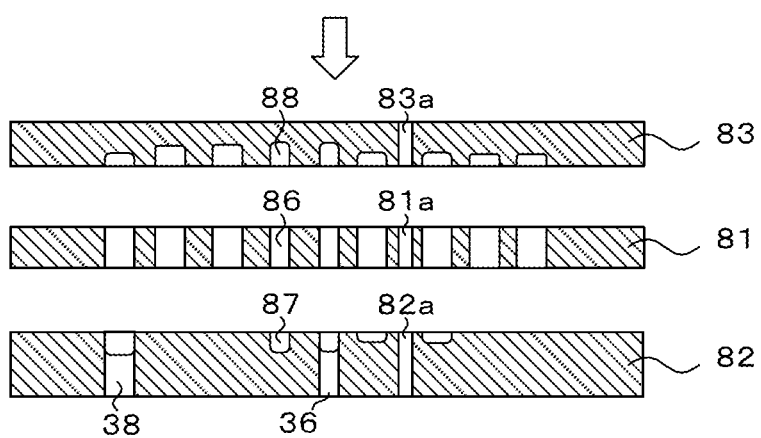

At the same time, the first to third thin plate portions 81 to 83, which are disc members with no holes or grooves, are prepared (FIG. 5A). When the ceramic plate 20 is made of alumina, the first to third thin plate portions 81 to 83 are preferably made of SiSiCTi or AlSiC. This is because the thermal expansion coefficients of SiSiCTi and AlSiC can be made substantially the same as the thermal expansion coefficient of alumina.

A SiSiCTi disc member can be made, for example, in the following manner. First, silicon carbide, metallic Si, and metallic Ti are mixed together to form a powder mixture. The resulting powder mixture is subjected to uniaxial pressing to form a disc-shaped molded body. Then, the molded body is hot-press sintered under inert atmosphere to produce a SiSiCTi disc member.

Next, the first passage portion 86 and a first terminal hole part 81a are formed in the first thin plate portion 81. The second passage portion 87, the cooling medium supply path 36, the cooling medium discharge path 38, and a second terminal hole part 82a are formed in the second thin plate portion 82. The third passage portion 88 and a third terminal hole part 83a are formed in the third thin plate portion 83 (FIG. 5B). The first passage portion 86, which is a through groove vertically penetrating the first thin plate portion 81, can be formed by a hollowing-out process. For example, the hollowing-out process may be performed by using a wire saw or wire discharge, or may be performed by cutting or grinding. In the case of using a wire saw or wire discharge, a through hole is first formed at any point in the region where the through groove is to be made. A wire is then passed through the through hole before start of the hollowing-out process. The first to third terminal hole parts 81a to 83a can also be formed by the hollowing-out process. The second passage portion 87 and the third passage portion 88, which are bottomed grooves, can be formed by cutting or grinding. The bottomed grooves each are preferably rounded at the boundary between the side face and the bottom face of the groove. The cooling medium supply path 36 and the cooling medium discharge path 38 are holes each vertically extending from the lower surface of the second thin plate portion 82 to the second passage portion 87. The cooling medium supply path 36 and the cooling medium discharge path 38 can be formed by cutting or grinding.

Referring back to FIGS. 4A to 4F, a metal joining material 90 is placed between the lower surface of the ceramic plate 20 having the feed terminal 54 attached thereto and the third thin plate portion 83, a second metal joining material 185 is placed between the lower surface of the third thin plate portion 83 and the upper surface of the first thin plate portion 81, and a first metal joining material 184 is placed between the lower surface of the first thin plate portion 81 and the second thin plate portion 82, so that the components described above are stacked together in layers (FIG. 4D). The first and second metal joining materials 184 and 185 each have through holes formed, in advance, at positions facing the first passage portion 86 and the first terminal hole part 81*a* in the first thin plate portion 81. The feed terminal 54 is passed through the first to third terminal hole parts 81*a* to 83*a*. A joined body 110 is produced by applying pressure and heat at the same time (by means of TCB) to the layered body obtained as described above (FIG. 4E). The joined body 110 includes the cooling plate 30 and the ceramic plate 20 joined to the upper surface of the cooling plate 30, with the metal joining layer 40 therebetween. The cooling plate 30 includes the second thin plate portion 82, the first thin plate portion 81 joined to the second thin plate portion 82, with the first metal joining layer 84 therebetween, and the third thin plate portion 83 joined to the first thin plate portion 81, with the second metal joining layer 85 therebetween. The terminal hole 51 is a hole including the terminal-hole upper portion 151*a* and the first to third terminal hole parts 81*a* to 83*a* communicating with the terminal-hole upper portion 151*a*.

The TCB described above is performed, for example, in the following manner. That is, after pressure-bonding of the layered body at a temperature lower than or equal to the solidus temperature of the metal joining material (e.g., at a temperature higher than or equal to a temperature obtained by subtracting 20° C. from the solidus temperature and lower than or equal to the solidus temperature), the layered body is left to reach room temperature. The metal joining material is thus formed into a metal joining layer. Examples of the metal joining material include an Al—Mg joining material and an Al—Si—Mg joining material. For example, when TCB is performed using an Al—Si—Mg joining material, the layered body is subjected to pressure while being heated under vacuum atmosphere. It is preferable to use a metal joining material that is around 100 µm thick.

Next, an outer region of the ceramic plate 20 is cut to form a step, so as to produce a structure including the central portion 22 and the outer portion 24. Also, an outer region of the cooling plate 30 is cut to form a step, so as to produce a structure including the flange portion 34. Next, the insulating pipe 55 for insertion of the feed terminal 54 is placed in the terminal hole 51. The insulating pipe 55 extends from the lower surface of the ceramic plate 20 to the lower surface of the cooling plate 30. Additionally, the insulating film 42 is formed by thermally spraying, with ceramic powder, the side face of the outer portion 24 of the ceramic plate 20, the perimeter of the metal joining layer 40, and the side face of the cooling plate 30 (FIG. 4F). The wafer placement table 10 is thus produced.

An example of how the wafer placement table 10 is used will now be described with reference to FIG. 1. As described above, the wafer placement table 10 is secured by the clamp member 70 to the installation plate 96 in the chamber 94. A ceiling surface of the chamber 94 is provided with a showerhead 98 having many gas injection holes through which a process gas is released into the chamber 94.

The focus ring 78 is placed on the FR placement surface 24*a* of the wafer placement table 10, and the wafer W having a disc shape is placed on the wafer placement surface 22*a*. The focus ring 78 has a step that extends along the inner periphery of an upper end portion thereof in such a way as to avoid interference with the wafer W. The wafer W is attracted to the wafer placement surface 22*a* by applying a direct-current voltage from the wafer attracting direct-current power supply 52 to the wafer attracting electrode 26. After the atmosphere in the chamber 94 is set to a predetermined vacuum state (or reduced-pressure state), a RF voltage from the RF power supply 62 is applied to the cooling plate 30 while a process gas is supplied from showerhead 98. This generates plasma between the wafer W and the showerhead 98. The plasma is used to perform CVD or etching on the wafer W. A temperature-adjusted cooling medium circulates through the cooling medium passage 32. Although the focus ring 78 wears out as the plasma treatment of the wafer W proceeds, the replacement of the focus ring 78 takes place after treatment of more than one wafer W because the focus ring 78 is thicker than the wafer W.

The wafer W needs to be efficiently cooled down when treated with high-power plasma. In the wafer placement table 10, the metal joining layer 40 with high thermal conductivity, not a resin layer with low thermal conductivity, is used as a joining layer between the ceramic plate 20 and the cooling plate 30. This allows the wafer placement table 10 to have a high capability (or heat removing capability) of drawing heat from the wafer W. A difference in thermal expansion between the ceramic plate 20 and the cooling plate 30 is small and unlikely to cause a problem even when the metal joining layer 40 does not have high stress relaxation properties. The cross-sectional size of the cooling medium passage 32 is determined in accordance with the distribution of high-temperature-prone and low-temperature-prone regions of the wafer W that tend to be higher and lower, respectively, in temperature during use of the wafer placement table 10. To adjust the cross-sectional size of the cooling medium passage 32, the distance d1 from the wafer placement surface 22*a* to the upper base of the cooling medium passage 32 and the distance d2 from the wafer placement surface 22*a* to the lower base of the cooling medium passage 32 may be varied, or the width w of the cooling medium passage 32 may be varied. The distance d1 may be shortened in places corresponding to high-temperature-prone regions of the wafer W. The flow speed of the cooling medium passing through the cooling medium passage 32 is preferably 15 L/min to 50 L/min, and more preferably 20 L/min to 40 L/min.

In the embodiments described above, the first thin plate portion 81 corresponds to a first plate portion of the present invention, the second thin plate portion 82 corresponds to a second plate portion of the present invention, and the third thin plate portion 83 corresponds to a third plate portion of the present invention.

In the wafer placement table 10 of the present embodiment described above, the distance from the wafer placement surface 22*a* to at least one of the upper base or the lower base of the cooling medium passage 32 is varied in accordance with the distribution of high-temperature-prone and low-temperature-prone regions of the wafer W placed on the wafer placement surface 22*a*. This can improve thermal uniformity in the wafer W.

The cooling plate 30 is a structure formed by metal-joining a plurality of thin plate portions, including the first thin plate portion 81 and the second thin plate portion 82 joined to each other. The first thin plate portion 81 has the first passage portion 86. The first passage portion 86 is a through groove having the same shape as the cooling medium passage 32 in plan view. The second thin plate portion 82 has the second passage portion 87. The second passage portion 87 is a bottomed groove disposed in at least part of the region facing the first passage portion 86. The first passage portion 86 in the first thin plate portion 81 can be formed at low cost, for example, by a hollowing-out process. The second passage portion 87 in the second thin plate portion 82 can be formed, for example, by a cutting or grinding process. The second passage portion 87, which is relatively shallow in depth, can be formed in a short time and at low cost.

The width w of the cooling medium passage 32 is not constant throughout the length of the cooling medium passage 32 but varies. By varying the width w of the cooling medium passage 32 in accordance with the distribution of high-temperature-prone and low-temperature-prone regions of the wafer placement surface 22a, the thermal uniformity in the wafer W can be improved.

The cooling plate 30 further includes the third thin plate portion 83 joined to a surface of the first thin plate portion 81 opposite the second thin plate portion 82. The third thin plate portion 83 has the third passage portion 88. The third passage portion 88 is a bottomed groove disposed in at least part of the region facing the first passage portion 86. This makes it possible to change the position of one or both of the upper and lower bases of the cooling medium passage 32.

The cooling medium passage 32 is preferably rounded at the boundary between the side face and the upper base thereof, and at the boundary between the side face and the lower base thereof. This can reduce the occurrence of cracks originating from these boundaries.

The present invention is by no means limited to the embodiments described above, and can be implemented in various ways within the technical scope of the present invention.

Figure 6:
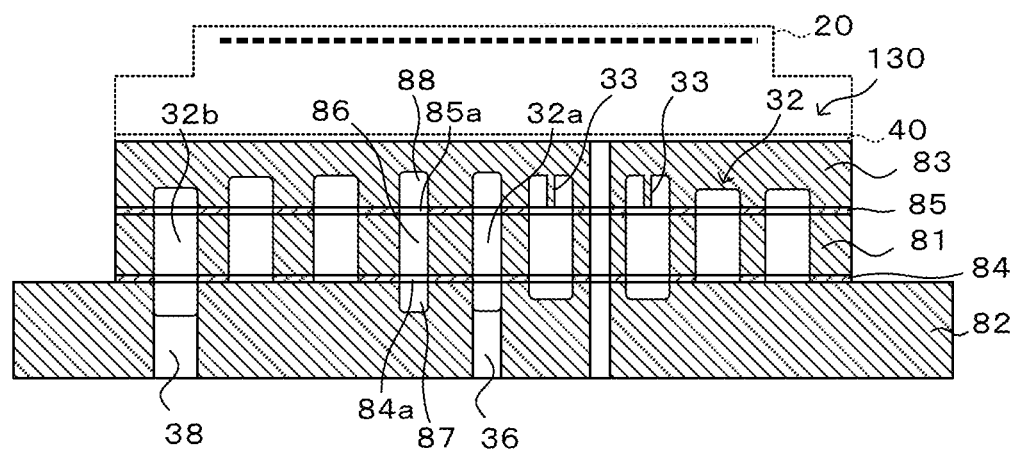
FIG. 6 is a vertical cross-sectional view of a cooling plate 130.

In the embodiments described above, the cooling plate 30 may be replaced by a cooling plate 130 illustrated in FIG. 6. In FIG. 6, the same constituent elements as those in the embodiments described above are denoted by the same reference numerals. The cooling plate 130 has one or more fins 33 on the upper base of the cooling medium passage 32. In the cooling medium passage 32, the fins 33 are provided at positions corresponding to high-temperature-prone regions of the wafer placement surface 22a, so that the wafer W can be cooled down efficiently. More (or longer) fins 33 may be provided at positions corresponding to high-temperature-prone regions of the wafer placement surface 22a. The fins 33 can be easily machined, as they each are provided on the base of the third passage portion 88, which is a relatively shallow bottomed groove. The fins 33 may each be provided on the lower base of the cooling medium passage 32 (i.e., on the base of the second passage portion 87, which is a bottomed groove), instead of on the upper base of the cooling medium passage 32, or may be provided on both the upper and lower bases of the cooling medium passage 32.

Figure 7:
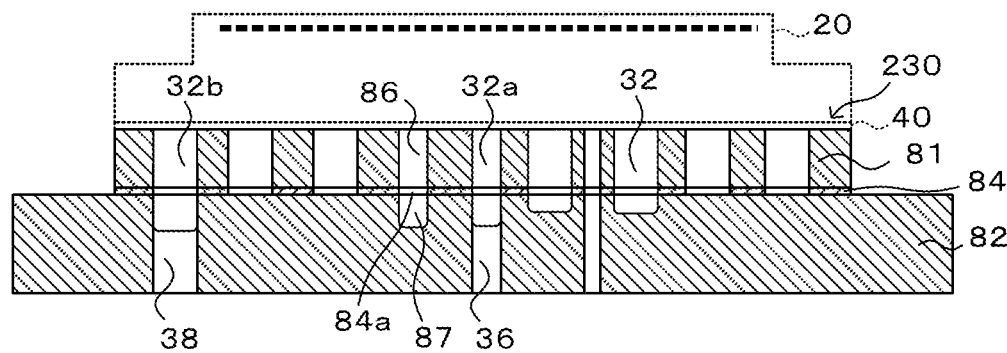
FIG. 7 is a vertical cross-sectional view of a cooling plate 230.

In the embodiments described above, the cooling plate 30 may be replaced by a cooling plate 230 illustrated in FIG. 7. In FIG. 7, the same constituent elements as those in the embodiments described above are denoted by the same reference numerals. The cooling plate 230 is a two-layered structure including the first and second thin plate portions 81 and 82 joined by the metal joining layer 84. The upper surface of the first thin plate portion 81 of the cooling plate 230 is joined to the lower surface of the ceramic plate 20, with the metal joining layer 40 therebetween. In this case, an upper opening of the cooling medium passage 32 is closed by the metal joining layer 40 (ceramic plate 20).

Figure 8:
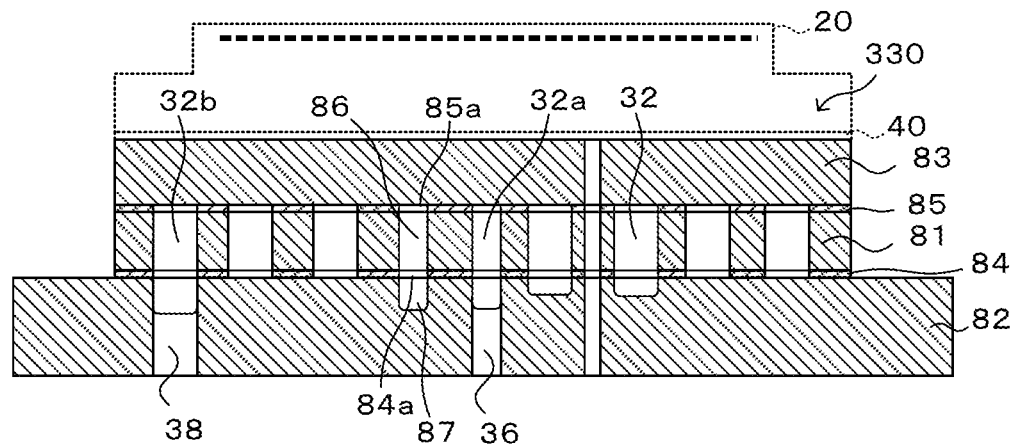
FIG. 8 is a vertical cross-sectional view of a cooling plate 330.

In the embodiments described above, the cooling plate 30 may be replaced by a cooling plate 330 illustrated in FIG. 8.

In FIG. 8, the same constituent elements as those in the embodiments described above are denoted by the same reference numerals. The cooling plate 330 is a three-layered structure in which the first and second thin plate portions 81 and 82 are joined by the metal joining layer 84, and the first and third thin plate portions 81 and 83 are joined by the metal joining layer 85. The first thin plate portion 81 has the first passage portion 86 (through groove), and the second thin plate portion 82 has the second passage portion 87 (bottomed groove). The upper surface of the third thin plate portion 83 of the cooling plate 330 is joined to the lower surface of the ceramic plate 20 by the metal joining layer 40 therebetween. The third thin plate portion 83 does not have the third passage portion 88 (bottomed groove). That is, the surface of the third thin plate portion 83 facing the first thin plate portion 81 is flat. In this case, the height of the upper base of the cooling medium passage 32 is constant.

Figure 9:
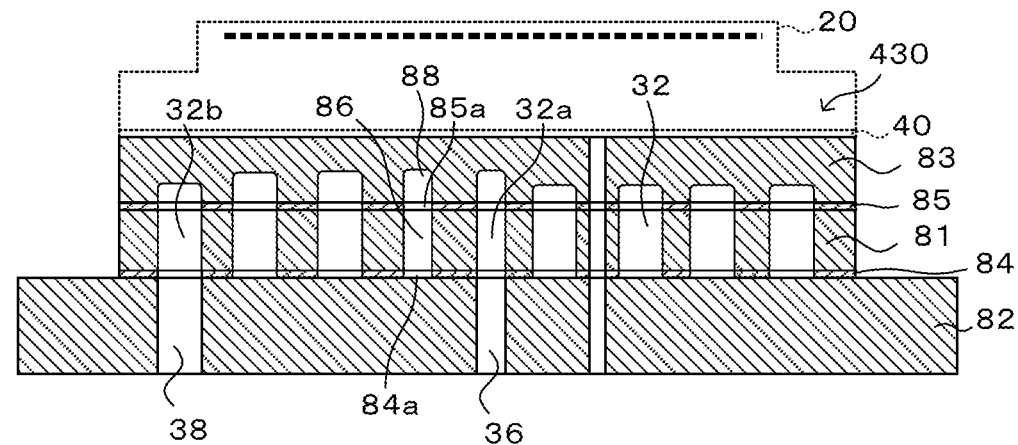
FIG. 9 is a vertical cross-sectional view of a cooling plate 430.

In the embodiments described above, the cooling plate 30 may be replaced by a cooling plate 430 illustrated in FIG. 9. In FIG. 9, the same constituent elements as those in the embodiments described above are denoted by the same reference numerals. The cooling plate 430 is a three-layered structure in which the first and second thin plate portions 81 and 82 are joined by the metal joining layer 84, and the first and third thin plate portions 81 and 83 are joined by the metal joining layer 85. The first thin plate portion 81 has the first passage portion 86 (through groove), and the third thin plate portion 83 has the third passage portion 88 (bottomed groove). The upper surface of the third thin plate portion 83 of the cooling plate 430 is joined to the lower surface of the ceramic plate 20 by the metal joining layer 40 therebetween. The second thin plate portion 82 does not have the second passage portion 87 (bottomed groove). That is, the surface of the second thin plate portion 82 facing the first thin plate portion 81 is flat. In this case, the height of the lower base of the cooling medium passage 32 is constant. In the case of the cooling plate 430 alone, the first thin plate portion 81 corresponds to the first plate portion of the present invention, the third thin plate portion 83 corresponds to the second plate portion of the present invention, and the second thin plate portion 82 corresponds to the third plate portion of the present invention.

Although the cooling plate 30 is a three-layered structure including the first to third thin plate portions 81 to 83 in the embodiments described above, the cooling plate 30 may be a structure including four or more layers.

In the embodiments described above, the wafer placement surface 22a may have a seal band along the outer edge thereof and a plurality of small protrusions over the entire surface thereof, so as to support the wafer W with the top face of the seal band and the tips of the plurality of small protrusions.

In the embodiments described above, the wafer placement table 10 may have a plurality of holes vertically penetrating the wafer placement table 10. Examples of such holes include gas holes opening in the wafer placement surface 22a, and lift pin holes for insertion of lift pins with which the wafer W is lifted and lowered with respect to the wafer placement surface 22a. The gas holes are provided at appropriate points in plan view of the wafer placement surface 22a. A heat-transfer gas, such as He gas, is supplied into the gas holes. In the wafer placement surface 22a provided with the seal band and small protrusions described above, the gas holes are generally formed to open in the area where the seal band and small protrusions are not provided. When the heat-transfer gas is supplied into the gas holes, a space on the backside of the wafer W adjacent to the wafer placement surface 22a is filled with the heat-transfer gas. Lift pin holes are arranged at regular intervals along concentric circles of the wafer placement surface 22a in plan view of the wafer placement surface 22a.

Although the ceramic plate 20 and the cooling plate 30 are joined by the metal joining layer 40 therebetween, the configuration is not particularly limited to this. For example, a resin joining layer may be used instead of the metal joining layer 40.

Although the central portion 22 of the ceramic plate 20 contains the wafer attracting electrode 26 in the embodiments described above, the central portion 22 may contain a RF electrode for plasma generation or a heater electrode (resistance heating element), instead of, or in addition to, the wafer attracting electrode 26. The outer portion 24 of the ceramic plate 20 may contain a focus ring (FR) attracting electrode, a RF electrode, or a heater electrode.

In the embodiments described above, the ceramic plate 20 is made by hot-press firing a ceramic powder molded body. The molded body may be made by stacking a plurality of tape-cast layers, by a mold casting method, or by compacting ceramic powder.

Although the first to third thin plate portions 81 to 83 are made of a metal-ceramic composite in the embodiments described above, the first to third thin plate portions 81 to 83 made of an easily workable material may be used. As an index of workability, for example, the machinability index defined in JIS B 0170 (2020) can be used. The easily workable material is preferably a material with a machinability index of 40 or greater, more preferably a material with a machinability index of 100 or greater, and still more preferably a material with a machinability index of 140 or greater. Examples of the easily workable material include aluminum, aluminum alloy, and stainless steel (SUS material).

Although the cooling medium passage 32 is formed in a spiral shape in the embodiments described above, the shape is not particularly limited to this and the cooling medium passage 32 may be formed in any one-stroke pattern. For example, the cooling medium passage 32 may be formed in a zigzag shape.

In the embodiments described above, the ceramic plate 20 having the wafer placement surface 22a may be configured without a FR placement surface.

International Application No. PCT/JP2022/035900 filed on Sep. 27, 2022, is incorporated herein by reference in its entirety.

What is claimed is:

1. A wafer placement table comprising:
   a ceramic plate having a wafer placement surface at an upper surface thereof and containing an electrode therein, the wafer placement surface being a surface on which a wafer can be placed;
   a cooling plate made of a metal-ceramic composite and having a cooling medium passage; and
   a joining layer configured to join the ceramic plate to the cooling plate,
   wherein a distance from the wafer placement surface to at least one of upper base or lower base of the cooling medium passage is not constant throughout a length of the cooling medium passage but varies; and
   the cooling plate has a plurality of plate portions including a first plate portion and a second plate portion, and has a structure in which the plurality of plate portions metal-joined to each other,
   the first plate portion having a first passage portion which is a through groove provided to have the same shape as the cooling medium passage in plan view, and
   the second plate portion having a second passage portion which is a bottomed groove disposed in at least part of a region facing the first passage portion.

2. The wafer placement table according to claim 1, wherein a width of the cooling medium passage is not constant throughout the length of the cooling medium passage but varies.

3. The wafer placement table according to claim 1, wherein the cooling medium passage is partially provided with a fin on at least one of the upper base or the lower base of the cooling medium passage.

4. The wafer placement table according to claim 1, wherein the cooling plate includes a third plate portion joined to a surface of the first plate portion opposite the second plate portion, and the third plate portion has a third passage portion which is a bottomed groove disposed in at least part of a region facing the first passage portion.

5. The wafer placement table according to claim 1, wherein the cooling plate includes a third plate portion joined to a surface of the first plate portion opposite the second plate portion, and a surface of the third plate portion facing the first passage portion is flat.

* * * * *